United States Patent [19]

Barton et al.

[11] 4,157,040
[45] Jun. 5, 1979

[54] APPARATUS FOR COLLECTING PYROLYSATES FROM A GAS-COOLED DYNAMOELECTRIC MACHINE

[75] Inventors: Sterling C. Barton, Scotia; Chester C. Carson, Ballston Spa; Allen D. Albert, Saratoga, all of N.Y.

[73] Assignee: General Electric Company, Schenectady, N.Y.

[21] Appl. No.: 868,366

[22] Filed: Jan. 10, 1978

Related U.S. Application Data

[63] Continuation of Ser. No. 639,438, Dec. 10, 1975, abandoned.

[51] Int. Cl.² .............................................. G01N 1/22
[52] U.S. Cl. ............................................... 73/421.5 R
[58] Field of Search ................. 73/421.5 R, 422 R, 23

[56] References Cited

U.S. PATENT DOCUMENTS

| | | | |
|---|---|---|---|
| 3,427,880 | 2/1969 | Grobel et al. | 73/339 |
| 3,613,665 | 10/1971 | Gorsuch | 73/421.5 R |
| 3,766,715 | 10/1973 | Archer | 73/421.5 R |
| 3,807,218 | 4/1974 | Carson et al. | 73/421.5 R |
| 3,916,671 | 11/1975 | Carson et al. | 73/23.1 |
| 3,972,225 | 8/1976 | Fort et al. | 73/421.5 R |
| 3,973,848 | 8/1976 | Jowett et al. | 73/23 |
| 3,978,732 | 9/1976 | Dillman | 73/421.5 R |

Primary Examiner—Anthony V. Ciarlante
Attorney, Agent, or Firm—James W. Mitchell; John F. Ahern; Ormand R. Austin

[57] ABSTRACT

In a gas-cooled dynamoelectric machine some machine parts may contain, or may be coated with, organic materials which may undergo thermal decomposition and emit pyrolysates into the machine gas coolant upon the occurrence of localized overheating in the machine parts. These pyrolysates are detectable by means of an ion chamber detector which may be put in fluid communication with the machine gas coolant. Different pyrolysates have different characteristics and thus are identifiable by various qualitative analysis techniques making it possible to locate the source of overheating in the dynamoelectric machine by knowing which parts are coated with selected organic materials. An apparatus for collecting pyrolysates is described having a multi-media collector therein for obtaining both gaseous and particulate pyrolysates.

6 Claims, 4 Drawing Figures

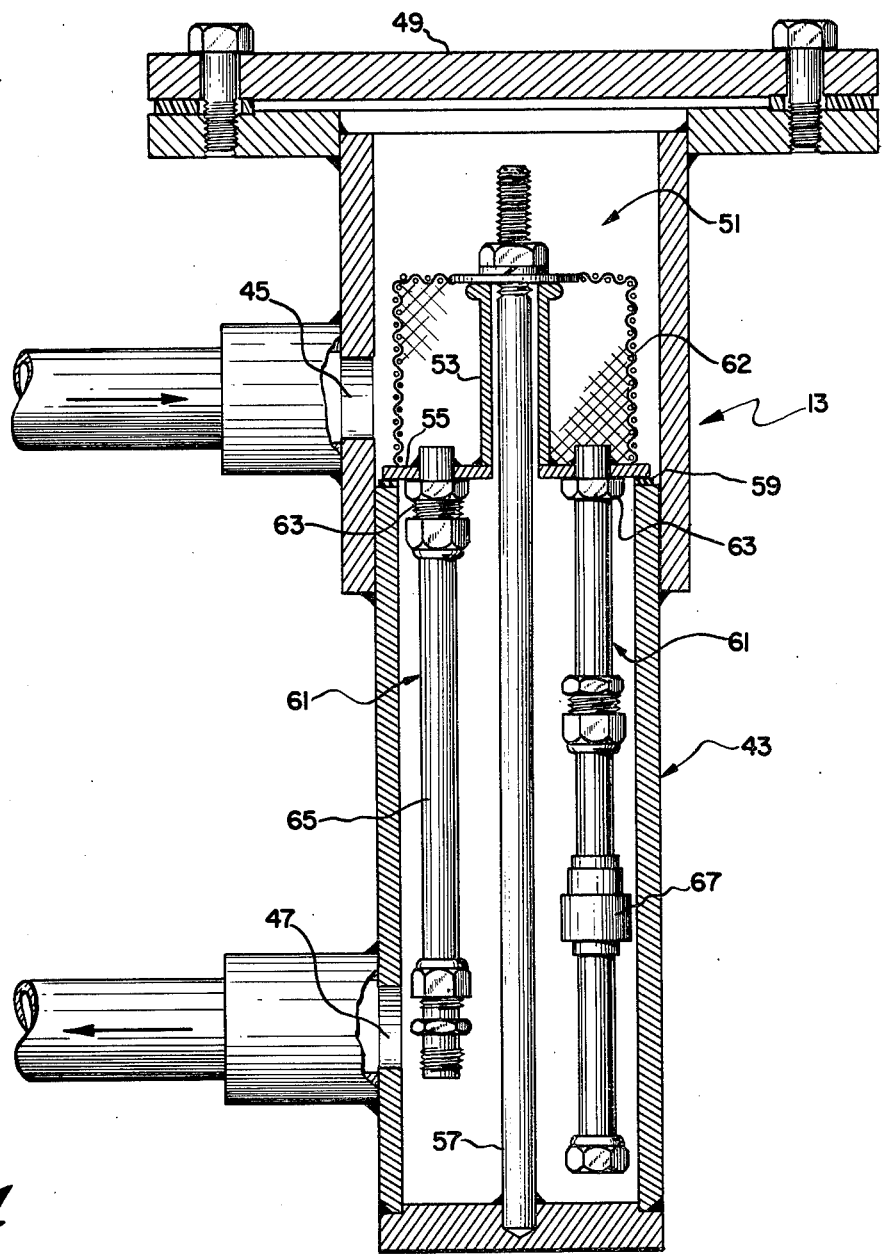
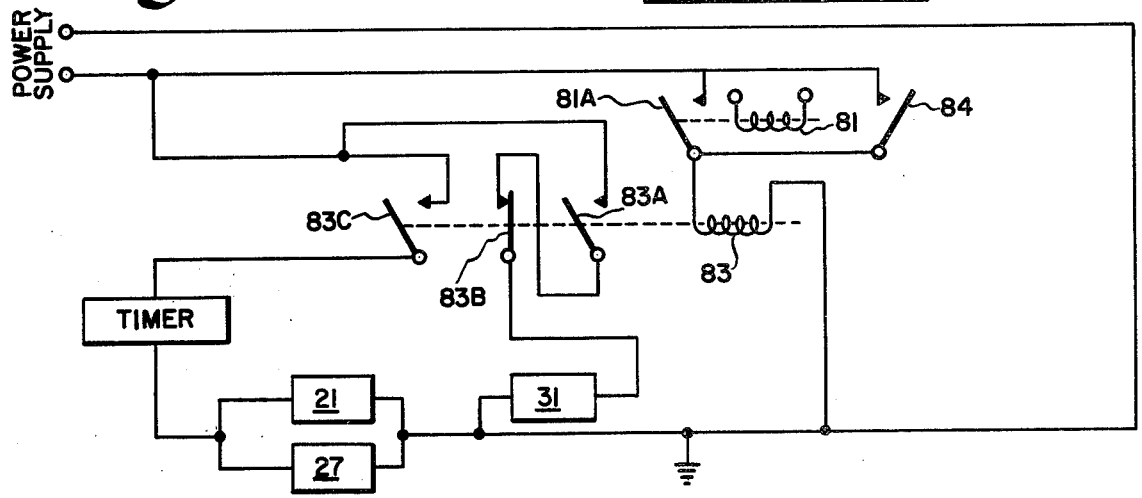

APPARATUS FOR COLLECTING PYROLYSATES FROM A GAS-COOLED DYNAMOELECTRIC MACHINE

This is a continuation, of application Ser. No. 639,438, filed Dec. 10, 1975 now abandoned.

BACKGROUND OF THE INVENTION

The invention relates, in general, to gas-cooled dynamoelectric machines; and, in particular, to an apparatus in combination with a gas-cooled dynamoelectric machine for collecting thermal decomposition products which may occur in the machine gas coolant if there is localized overheating of certain dynamoelectric machine parts.

In U.S. Pat. No. 3,428,838 to Carson et al issued Feb. 18, 1969, a wear detector apparatus comprising a mechanical filter is used in combination with a gas-cooled dynamoelectric machine to determine excessive wear of winding insulations caused by machine vibrations and thermal cycling. In other words, an external monitor is used to determine an internal operating condition of the dynamoelectric machine using the machine gas coolant as a carrier medium. This device is very useful in giving an early warning of a possible detrimental condition within the dynamoelectric machine prior to a more serious condition such as short circuit.

Another type of device in U.S. Pat. No. 3,427,880 to Grobel et al issued Feb. 18, 1969 takes advantage of the fact that certain types of machine coatings will emit thermal decomposition products when machine parts, thus coated, become overheated. The coatings are organic materials and the thermal decomposition products therefrom are pyrolysates. The patented invention employs an ion chamber detector of the type shown in U.S. Pat. No. 3,573,460 to Skala issued Apr. 6, 1971 in combination with a gas-cooled dynamoelectric machine. The ion chamber detector senses the presence of pyrolysates and sounds an alarm.

Localized overheating in a large gas-cooled dynamoelectric machine is a rare occurrence; however, a stator core damaged by overheating may lead to extensive machine outage and costly repairs. Hence, the invention described in U.S. Pat. No. 3,427,880 for detecting machine overheating makes an important contribution to the art by making possible an early warning of machine overheating. Because of the particular identifiable characteristics of pyrolysate products it is also possible to determine the location of the overheating, as pointed out in U.S. Pat. No. 3,807,218 to Carson et al issued Apr. 30, 1974. In that patent, a sampling device is used to collect pyrolysates whereupon the sample is removed from the sampling device for qualitative analysis. The sampling device comprises an absorbent sampling media such as silica gel primarily for removing particulate pyrolysates from the machine gas coolant. According to one aspect of the present invention, it has been found that the collection and analysis steps could be enhanced by the use of several different kinds of sampling media.

The present invention is an apparatus for collecting both gaseous and particulate products from the gas coolant of a gas-cooled dynamoelectric machine. The apparatus includes a collector which employs several different kinds of sampling media. The sampling media are contained in separate cartridges within the collector and are easily removable therefrom for analysis. The apparatus also includes a piping circuit which is so arranged as to permit an initial inlet purge, a collection step and an after-collection collector purge. Moreover, an electrical circuit is provided for controlling both the inlet purge and the collection step in timed sequence. Finally, the entire apparatus is packaged in a cabinet for modular assembly to a dynamoelectric machine.

It is therefore one object of the present invention to provide an improved apparatus for collecting thermal decomposition products from the gas coolant of a gas-cooled dynamoelectric machine.

It is another object of the present invention to provide a collector apparatus which optimizes the collection of both gaseous and particulate thermal decomposition products.

It is a further object of the present invention to provide a self-contained collector apparatus which includes purge cycles and wherein the collected samples are readily removable therefrom.

These objects and advantages of the present invention will become apparent from the following detailed description of the invention when taken in connection with the appended drawings.

BRIEF DESCRIPTION OF THE DRAWINGS

FIG. 3 is an elevation view, in cross section, of the collector taken along the lines 3—3 of FIG. 2.

FIG. 4 is a schematic view of the electrical circuit used in combination with the collector apparatus.

DETAILED DESCRIPTION OF THE INVENTION

Figure 1:
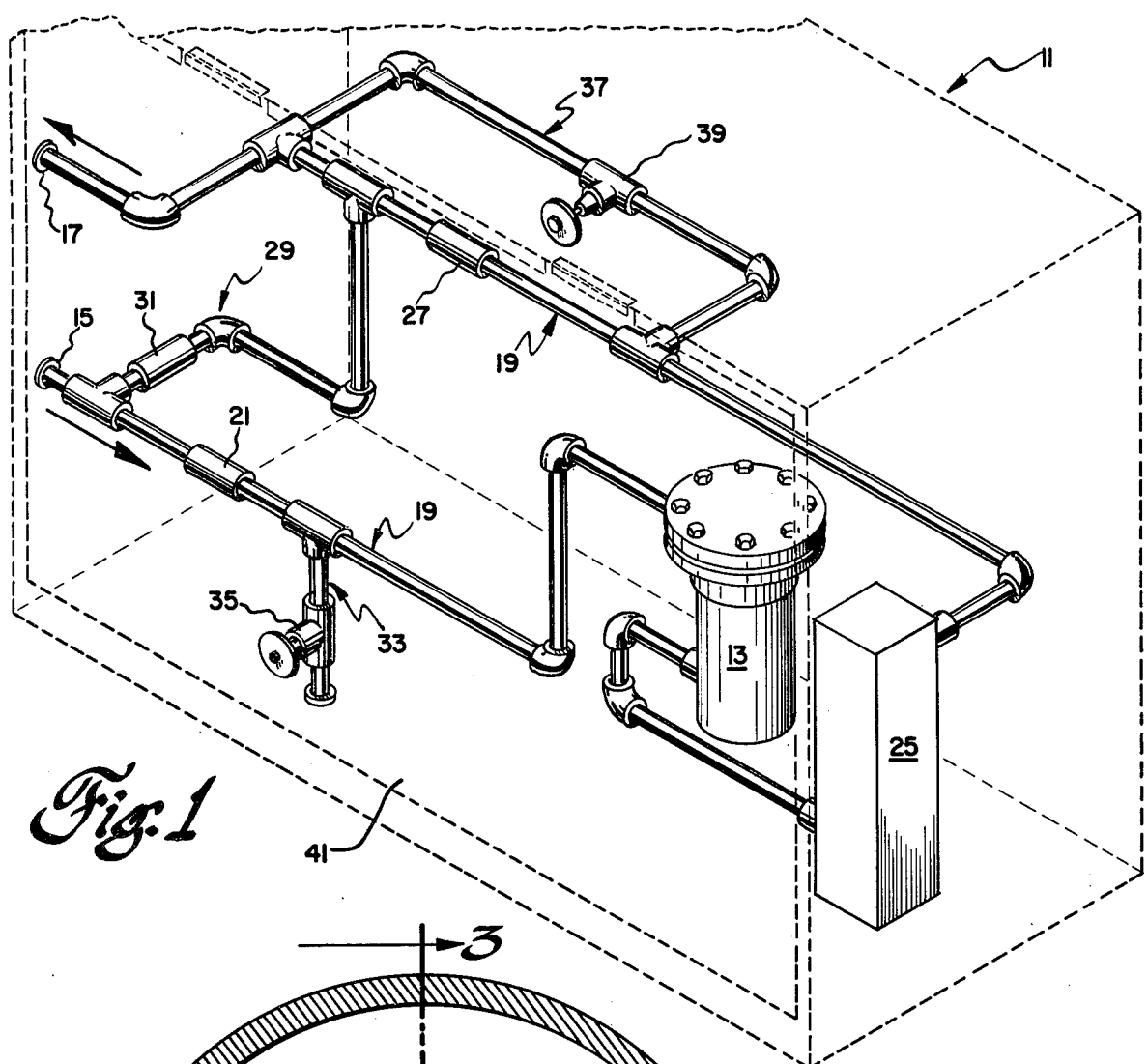
FIG. 1 is an isometric view of the collector apparatus including a cabinet enclosure indicated in dashed lines.

Referring to FIG. 1, the collector apparatus includes a cabinet 11 which houses a collector 13 and a piping circuit including a plurality of valves and connections. The collector apparatus is used in combination with a gas-cooled dynamoelectric machine wherein the gas coolant or machine gas is usually hydrogen. The dynamoelectric machine has not been shown since the prior art is replete with such showings in the previously cited patents. The machine gas coolant is input into the collector apparatus through a gas inlet 15 which is connected to a pipe (not shown) which taps machine gas coolant from the dynamoelectric machine in a manner shown, for example, in U.S. Pat. No. 3,807,218 to Carson et al issued Apr. 30, 1974. The gas inlet is in fluid communication with a gas outlet 17 through a main conduit 19 which serially contains the following elements: an inlet solenoid valve 21, the collector 13, a flow meter 25 and an outlet solenoid valve 27.

An inlet purge line 29 interconnects the gas inlet 15 with the gas outlet 17 at points upstream from the inlet solenoid valve 21 and downstream from the outlet solenoid valve respectively, and hence short circuits the main conduit portion which includes the collector 13. Flow through the inlet purge line is controlled by a purge solenoid valve 31.

A collector purge line 33 is connected into the main conduit 19 at a point downstream from the inlet solenoid valve 21 and upstream from the collector 13. Flow through the collector purge line may be conveniently controlled by a manual valve 35. In conjunction with the collector purge line 33 there is also a bypass line 37 having an inlet end connected upstream from the outlet solenoid valve 27 and an outlet end connected downstream from the outlet solenoid valve. Flow through the bypass line is controlled by a manual valve 39. The collector purge line 33 and the bypass line 37 are used in combination to purge hydrogen gas from the collector in order to obviate any risk of explosion or fire. The collector purge gas used may be nitrogen gas which is relatively inert. In addition, the gas outlet may be connected to an appropriate vent and a pump may be provided, if necessary, to establish a pressure differential between the gas inlet and the gas outlet.

The cabinet 11 may be provided with a removable or hinged front panel 41 to allow easy access to the interior of the cabinet for retrieving the collector cartridges without disconnecting the collector apparatus from the dynamoelectric machine.

Figure 2:
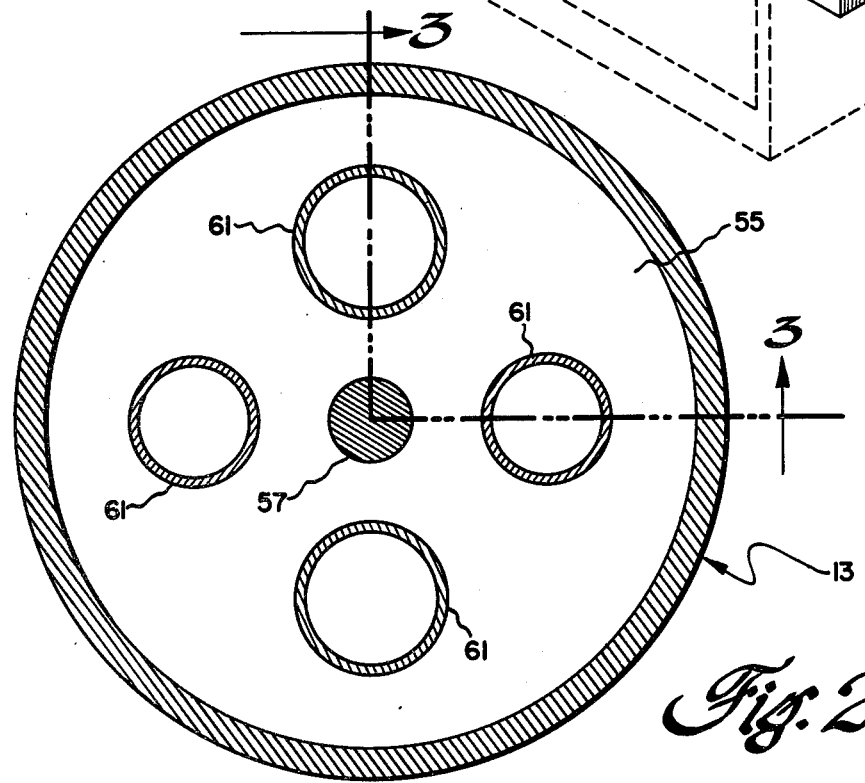
FIG. 2 is a plan view, in cross section, of a portion of the collector showing one arrangement of sampling cartridges.

Referring now to FIGS. 2 and 3, the collector 13 included in the collector apparatus includes a generally cylindrical gas manifold 43 having a gas inlet port 45 connected to an upstream portion of the main gas conduit, and a gas outlet port 47 connected to a downstream portion of the main gas conduit. The manifold is open at one end and includes a removable cover 49 which is bolted to the manifold and which allows access to the interior of the manifold.

A cartridge holder 51 is removably mounted within the manifold. The cartridge holder includes an upright handle portion 53 and a disc portion 55, said handle portion 53 being centered into place within the manifold by rod 57 attached to the closed end of the manifold. The cartridge holder is inserted into the manifold until the disc contacts an annular stop 59. The cartridge holder includes a plurality of cartridge samplers 61. Moreover, the cartridge holder may include a filter element 62 in the form of a close-weave steel cap fitted over the samplers within the collector 13.

It has been found advantageous, according to the present invention, to use several different cartridge samplers for optimizing the collection of both gaseous and particulate pyrolysates. For this reason, the disc 55 contains a plurality of fittings 63 to which the several cartridge samplers may be removably secured. For example, one such sampling medium is a Tenax GC for collecting gas pyrolysates. As such, the cartridge sampler 61 may take the form of an elongated tube 65, most of which is filled with the sampling medium. The Tenax GC may be analyzed by means of gas chromatography, mass spectrometry or a combination thereof. The Tenax GC material used for gas chromatographic columns is available from Applied Science Laboratories, Inc., located in State College, Pa. 16801. A lower flow rate of gas coolant through the Tenax sampler is achieved by applying a restriction at the outlet end of the sampler. The restriction may be a sintered metal disc. The lower rate of flow through the Tenax sampler permits an adequate flow through the Tenax sampler while also allowing a higher rate of flow through other sampler devices. Moreover, the restriction is useful in retaining the sampling medium within the sampler.

Another type of sampling media is a glass disc filter comprising a glass microfiber filter pad for collecting particulate pyrolysates. Such a filter may be fitted into a receptacle 67 forming a part of a sampling cartridge. The particulate pyrolysates collected by the glass disc filter may be analyzed by mass spectrometry and/or gas chromatography. The glass disc filter is available from the Gelman Instrument Company, located in Ann Arbor, Mich. Prior to installation, the glass disc filter is baked at a suitable temperature such as 400° C. for a short time (30 minutes) to delete any organic matter that may be present.

The combination of gas chromatography and mass spectrometry on either the Tenax GC medium or the glass disc filters may also determine the presence of an oil mist in the gas coolant which may cause the ion chamber detector to send out an alarm signal prematurely.

While only two cartridge samplers are shown in the cross-section view of FIG. 3, it is apparent from FIG. 2 that any number of cartridges may be used. The sampling media may then be redundant or other types of sampling media may also be used. A third example is a membrane filter with an organic base of cellulose esters which may be fitted into a cartridge sampler. This type of filter lends itself to analysis by emission spectroscopy for the detection of metallic elements. A suitable type of filter is the Type HA, plain, available from the Millipore Corporation located in Bedford, Mass. The membrane filter is especially effective in collecting particulate pyrolysates.

FIG. 4 shows a schematic diagram of an electrical circuit to be used in combination with the collector apparatus. The electrical circuit is actuated by a signal from a detector device as, for example, an ion chamber detector (ICD). The signal from the ICD energizes a coil 81 which closes switch 81A to energize coil 83. Coil 83 closes switch 83A, and actuates time delay switches 83B and 83C. Closure of switch 83A opens inlet purge solenoid valve 31 until time delay switch 83B times itself out whereupon the purge solenoid valve will close. One selected period for opening the purge solenoid valve is on the order of 10 seconds. Time delay switch 83C is also set for 10 seconds after which it will close and actuate the timer. Hence, switch 83C closes as switch 83B opens. The timer is adjustable but may be set to run for 15 minutes during which time the inlet solenoid valve and the outlet solenoid valve are opened for collection. In other words, the sequence of operation of the present invention is an initial purge of the line connecting the dynamoelectric machine and the collector apparatus through the inlet purge line 29 with valve 31 opened for 10 seconds. Thereafter collection is made through the main conduit 19 with valves 21 and 27 held open by the timer for 15 minutes. Manual switch 84 may be closed for additional sampling, if desired. After the collection, valves 21 and 27 are closed and the cartridge holder may be removed from the collector. The front panel 41 is removed or opened to enable access to the collector. Manual valves 35 and 39 are opened to pass purge gas (nitrogen) to purge the collector of hydrogen gas. Thereafter, the valves 35 and 39 are shut down and the cover 49 is removed from the collector and the cartridge holder is removed from the apparatus for analysis. A replacement cartridge holder may then be inserted into the collector and the collector apparatus may be reset for sampling.

While there has been shown what is considered to be a preferred embodiment of the invention, it is also understood that other modifications may be made therein. It is intended to claim all such modifications as fall within the true spirit and scope of the invention.

What is claimed is:

1. An apparatus for collecting thermal decomposition products given off into a dynamoelectric machine gas coolant comprising:

a gas inlet and a gas outlet interconnected by a conduit having a collector disposed therein; said conduit having an inlet solenoid valve upstream from said collector and an outlet solenoid valve downstream from said collector;

an inlet purge line interconnecting the upstream side of the inlet valve with the downstream side of the outlet valve; said line having a purge solenoid valve therein;

a collector purge inlet line connected on the downstream side of said inlet valve; and, a bypass line having an inlet end connected to the upstream side of said outlet valve and an outlet end connected to the gas outlet;

an electrical circuit including first and second time delay switches; said first switch normally closed being connected to said purge solenoid valve; and, a timer included in said electrical circuit for actuating said inlet solenoid valve and said outlet solenoid valve, said timer being connected to said second switch which is normally open whereby energization of said electrical circuit causes the purge solenoid valve to open immediately and then close after a time delay whereas the normally closed inlet solenoid valve and the outlet solenoid valve are opened after the time delay for a time period set in the timer.

2. An apparatus for taking samples of a gas flow comprising:

a cabinet having a gas inlet and a gas outlet;

a piping system enclosed within said cabinet for connecting the gas inlet to the gas outlet through a multimedia collector, said collector comprising a manifold having an inlet port and an outlet port;

a cartridge holder removably mounted in said manifold for retaining a plurality of cartridges which may each have a distinct collecting media, said cartridges being mounted in a parallel relation with respect to the gas flow from the inlet port to the outlet port; said cartridge holder being removable from the manifold without disconnecting the manifold from the piping system;

an inlet solenoid valve and an outlet valve for collecting the gas sample flow through the collector;

a purge line connected upstream from said inlet solenoid valve and including a purge solenoid valve; and, an electrical circuit connected to said inlet solenoid valve and to said purge solenoid valve including means for sequentially opening and closing said purge solenoid prior to opening and closing said inlet solenoid for sampling.

3. A sampling apparatus adapted for connection to a gas-cooled dynamoelectric machine, said sampling apparatus adapted for collecting thermal decomposition products in a gas sample from said dynamoelectric machine, said sampling apparatus comprising:

a piping system adapted to be connected at an inlet end to said dynamoelectric machine;

a collector connected in said piping system for receiving a portion of said machine gas coolant, said collector including at least one collector cartridge which may be removed from said collector without disconnecting the collector from said piping system;

an inlet solenoid valve for controlling the flow of the gas sample to the collector;

a purge bypass connected upstream from said inlet solenoid valve and including a purge solenoid valve; and, an electrical circuit connected to said inlet solenoid valve and to said purge solenoid valve including means for sequentially opening and closing said purge solenoid prior to opening and closing said inlet solenoid valve for sampling.

4. The sampling apparatus of claim 3 further including an outlet solenoid valve for controlling the flow of the gas sample out of the collector.

5. The sampling apparatus of claim 4 wherein said collector further includes at least one cartridge adapted to collect particulate pyrolysates from the gas coolant and at least one cartridge adapted to collect gaseous pyrolysates from the gas coolant.

6. An apparatus for collecting products of thermal decomposition of a dynamoelectric machine from a gas coolant exposed to said products comprising:

a collector having an inlet port and an outlet port;

a gas inlet conduit connected to said inlet port, said inlet conduit having an inlet valve therein;

a gas outlet conduit connected to said outlet port, said outlet conduit having an outlet valve therein;

purge means for purging the portion of said gas inlet conduit upstream of said inlet valve; and, a control circuit for automatically operating said inlet valve and said purge means, said control circuit including a timer connected to said inlet valve, and a time delay relay having a first time delay switch connected to said purge means and a second time delay switch connected to said timer;

said control circuit when energized providing a sequence of operation such that the first time delay switch causes said purge means to operate for a first preset time interval and then said second time delay switch and said timer cause said inlet valve to open for a second time interval set in said timer.

* * * * *